US012662748B2

(12) United States Patent (10) Patent No.: US 12,662,748 B2
Izeki et al. (45) Date of Patent: Jun. 23, 2026

(54) SILICON SINGLE CRYSTAL GROWING METHOD

(71) Applicant: SUMCO CORPORATION, Tokyo (JP)

(72) Inventors: Takashi Izeki, Nagasaki (JP); Yasuhito Narushima, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 276 days.

(21) Appl. No.: 18/265,070

(22) PCT Filed: Dec. 2, 2021

(86) PCT No.: PCT/JP2021/044306
§ 371 (c)(1),
(2) Date: Jun. 2, 2023

(87) PCT Pub. No.: WO2022/118922
PCT Pub. Date: Jun. 9, 2022

(65) Prior Publication Data
US 2024/0003044 A1 Jan. 4, 2024

(30) Foreign Application Priority Data
Dec. 4, 2020 (JP) ................................. 2020-201978

(51) Int. Cl.
*C30B 15/04* (2006.01)
*C30B 15/20* (2006.01)
*C30B 29/06* (2006.01)
(52) U.S. Cl.
CPC .............. *C30B 15/04* (2013.01); *C30B 15/20* (2013.01); *C30B 29/06* (2013.01)
(58) Field of Classification Search
CPC ......... C30B 15/02; C30B 15/04; C30B 15/20; C30B 29/06
See application file for complete search history.

(56) References Cited

U.S. PATENT DOCUMENTS

2004/0083947 A1* 5/2004 Weber .................... C30B 29/06
117/19
2010/0133485 A1 6/2010 Kawazoe et al.
(Continued)

FOREIGN PATENT DOCUMENTS

DE 112008001160 T5 4/2010
JP 2000-351690 A 12/2000
(Continued)

OTHER PUBLICATIONS

Office Action issued in KR Patent Application No. 10-2023-7017886, Feb. 28, 2024, translation.
(Continued)

*Primary Examiner* — Hua Qi
(74) *Attorney, Agent, or Firm* — GREENBLUM & BERNSTEIN, P.L.C.

(57) ABSTRACT

There is provided a growing method of monocrystalline silicon including: pulling up monocrystalline silicon from a dopant-added melt in which a dopant is added to a silicon melt and growing the monocrystalline silicon according to Czochralski process, in which the monocrystalline silicon is grown by calculating a critical CV value, which is a product of a dopant concentration C and a pull-up speed V at a point of time when an abnormal growth occurred in the monocrystalline silicon; and controlling at least one of the dopant concentration C or the pull-up speed V to make a CV value, which is a product of the dopant concentration C and the pull-up speed V at the point of time, below the critical CV value.

4 Claims, 5 Drawing Sheets

(56)     References Cited

U.S. PATENT DOCUMENTS

2011/0049438  A1*    3/2011   Kawazone ............. C30B 29/06
                                                    252/512
2019/0352796  A1*   11/2019   Hourai ................... C01B 33/02

FOREIGN PATENT DOCUMENTS

| | | |
|---|---|---|
| JP | 2008-297167 A | 12/2008 |
| JP | 2012-1408 A | 1/2012 |
| JP | 2018-008832 A | 1/2018 |
| KR | 10-2019-0009354 A | 1/2019 |

OTHER PUBLICATIONS

IPRP issued in International Patent Application No. PCT/JP2021/044306, May 30, 2023, translation.
International Search Report issued in International Bureau of WIPO Patent Application No. PCT/JP2021/044306, dated Feb. 15, 2022, along with an English translation thereof.
Office Action issued in DE Patent Application No. 112021006295.6, Dec. 3, 2024, translation.

* cited by examiner

10

CONTROLLER — 13

MEMORY — 12

11

52

24

33A

Ar GAS

51

32

21

2

3

31

25

1

42

43

41

23

26

MD

22

53

27

Ar GAS

SILICON SINGLE CRYSTAL GROWING METHOD

TECHNICAL FIELD

The present invention relates to a growing method of monocrystalline silicon.

BACKGROUND ART

There has been conventionally known a growing method of monocrystalline silicon with a low electrical resistivity through a Czochralski method (hereinafter abbreviated as a "CZ method") by adding, at a high concentration, a volatile dopant such as red phosphorus (P), arsenic (As) or antimony (Sb) to a silicon melt (see, for instance, Patent Literature 1).

When such a method is used for manufacturing monocrystalline silicon, a large amount of dopant may be added to the silicon melt. This may make a degree of freezing-point depression extremely large, causing constitutional undercooling. The degree of freezing-point depression is a difference between a freezing point of a silicon melt and a freezing point of a dopant-added melt in which the dopant is added to the silicon melt.

Conditions under which constitutional undercooling occurs are formulated as a numerical formula (1) below.

[Numerical Formula 1]

$$\frac{G}{V} \leqq \frac{mC}{D} \cdot \frac{(1 - k_0)}{k_0} \qquad (1)$$

In the numerical formula (1), G denotes a temperature gradient (K/mm) of a melt under a solid-liquid interface; V denotes a pull-up speed (mm/min), m denotes a degree of freezing-point depression (K·cm$^3$/a toms); C denotes a dopant concentration; D denotes a diffusion coefficient (cm$^2$/sec); and $k_0$ denotes a segregation coefficient.

When a value on the right side is equal to or more than a value on the left side in the numerical formula (1), constitutional undercooling occurs.

When constitutional undercooling occurs, a region away from the solid-liquid interface is undercooled more than the solid-liquid interface, and a solidification rate in the region away from the solid-liquid interface is also higher than in the solid-liquid interface. When slight concave and convex portions are formed on the solid-liquid interface in such a state, crystal grows faster in the convex portion, so that the slight concave and convex portions are amplified to cause an abnormal growth (e.g., a cell growth). The occurrence of the abnormal growth causes a dislocation of the single crystal, making it impossible to obtain wafer products.

In order to inhibit the occurrence of the cell growth, a critical point at which the cell growth occurs bas been discussed by calculating G/V (i.e., a value obtained by dividing the temperature gradient G of the melt under the solid-liquid interface by the pull-up speed V), which is on the left side of the numerical formula (1). Measures have been taken to increase G/V upon the occurrence of the cell growth. Specifically, in order to inhibit the occurrence of the abnormal growth, the temperature gradient G of the melt under the solid-liquid interface is calculated and the pull-up conditions are reset to reduce the pull-up speed V.

CITATION LIST

Patent Literature(s)

Patent Literature 1: JP 2012-1408 A

SUMMARY OF THE INVENTION

Problem(s) to be Solved by the Invention

However, since calculating the temperature gradient G of the melt under the solid-liquid interface needs actual measurement data of the shape of the solid-liquid interface, it takes time to examine improvement conditions.

Patent Literature 1 discloses a technique for inhibiting a dislocation in which a critical pull-up speed is determined to reduce the pull-up speed V. However, excessively reducing the pull-up speed V disadvantageously increases the electrical resistivity of the monocrystalline silicon.

An object of the invention is to provide a growing method of monocrystalline silicon capable of quickly setting pull-up conditions for inhibiting the occurrence of an abnormal growth without an increase in an electrical resistivity (hereinafter also referred to simply as a resistivity) of the monocrystalline silicon.

Means for Solving the Problem(s)

According to the invention, in setting pull-up conditions for inhibiting the occurrence of an abnormal growth, a CV value, which is a product of the dopant concentration C and the pull-up speed V, is used as an index for determining growth conditions. The reason (mechanism) for using the CV value as an index for determining the growth conditions is now described.

As described above, the conditions under which constitutional undercooling occurs are formulated as the numerical formula (1). Multiplying both sides of the numerical formula (1) by the pull-up speed V provides a numerical formula (2) below.

[Numerical Formula 2]

$$G \leqq \frac{mC}{D} \cdot \frac{(1 - k_0)}{k_0} \cdot V \qquad (2)$$

On the right side of the numerical formula (2), terms other than the dopant concentration C and the pull-up speed V (i.e., m, D, $k_0$) are each a constant. Thus, the occurrence of constitutional undercooling can be examined only using the product of the pull-up speed V and the dopant concentration C (i.e., CV value).

Conventionally, a critical point at which the cell growth occurs has been examined by calculating G/V on the left side of the numerical formula (1). Although calculating G that is the temperature gradient of the melt under the solid-liquid interface requires actual measurement data of the shape of the solid-liquid interface, using the CV value as an index enables quick and easy quantitative discussion on the critical point at which the cell growth occurs.

A growing method of monocrystalline silicon according to an aspect of the invention includes: pulling up monocrystalline silicon from a dopant-added melt in which a dopant is added to a silicon melt and growing the monocrystalline silicon according to Czochralski process, in which the monocrystalline silicon is grown by calculating a critical CV value, which is a product of a dopant concentration C and a pull-up speed V at a point of time when an abnormal growth occurred in the monocrystalline silicon; and controlling at least one of the dopant concentration C or the pull-up speed V to make a CV value, which is a product of the dopant concentration C and the pull-up speed V at the point of time, below the critical CV value.

The growing method of monocrystalline silicon according to the aspect of the invention may further include: calculating the critical CV value; and resetting at least one of a pull-up speed profile or a resistivity profile in a crystal axis direction to make the CV value below the critical CV value calculated.

The growing method of monocrystalline silicon according to the aspect of the invention may further include, after the critical CV value is calculated and the resetting is performed, creating a target CV value profile by using a target CV value that does not exceed the critical CV value calculated at the point of time.

In the growing method of monocrystalline silicon according to the aspect of the invention, the resetting may include creating a modified pull-up speed profile constituted by a pull-up speed corresponding to the target CV value profile.

In the growing method of monocrystalline silicon according to the aspect of the invention, the resetting may include creating a modified resistivity profile constituted by a resistivity corresponding to the target CV value profile.

In the growing method of monocrystalline silicon according to the aspect of the invention, the dopant concentration C may be a dopant concentration in the monocrystalline silicon, and the dopant concentration in the monocrystalline silicon may be calculated from a resistance value of the monocrystalline silicon by using a relational expression of the dopant concentration in the monocrystalline silicon and the resistivity of the monocrystalline silicon.

The relational expression may be Irvin curves.

According to the aspect of the invention, using the CV value as an index for setting pull-up conditions allows the pull-up conditions to be quickly set without an increase in resistivity of the monocrystalline silicon.

BRIEF DESCRIPTION OF DRAWING(S)

FIG. 2 is a flowchart for explaining a growing method of monocrystalline silicon according to the exemplary embodiment of the invention.

DESCRIPTION OF EMBODIMENT(S)

A preferred exemplary embodiment of the invention is described below in detail with reference to the attached drawings.

A growing method of monocrystalline silicon of the invention, which inhibits the occurrence of an abnormal growth during the pull-up of monocrystalline silicon, includes resetting pull-up conditions on the basis of actual results at the time of the occurrence of the abnormal growth.

Specifically, by paying attention to parameters (i.e., a dopant concentration C and a pull-up speed V) in the numerical formula (1), a CV value, which is a product of the dopant concentration C and the pull-up speed V, is used as an index for setting the pull-up conditions.

Further, the invention is suitable for growing monocrystalline silicon with extremely low resistance. Such monocrystalline silicon has a resistivity of 1.3 mΩ·cm or less when a dopant is red phosphorus; a resistivity of 2.6 mΩ·cm or less when the dopant is arsenic; a resistivity of 20 mΩ·cm or less when the dopant is antimony; and a resistivity of 1.3 mΩ·cm or less when the dopant is boron.

Single Crystal Growth Device

Figure 1:
FIG. 1 is a conceptual illustration of an exemplary structure of a semiconductor crystal manufacturing device according to an exemplary embodiment of the invention.

FIG. 1 is a conceptual illustration of an exemplary structure of a semiconductor crystal manufacturing device 10 to which the growing method of monocrystalline silicon according to the exemplary embodiment is applied. The semiconductor crystal manufacturing device 10 manufactures monocrystalline silicon 1 through the CZ method.

The semiconductor crystal manufacturing device 10 includes a device body 11, a memory 12, and a controller 13. The device body 11 includes a chamber 21, a crucible 22, a heater 23, a pull-up unit 24, a heat shield 25, a heat insulation material 26, and a crucible driver 27. A dopant-added melt MD in which a dopant is added to a silicon melt is charged in the crucible 22.

The chamber 21 includes a main chamber 31 and a pull chamber 32 connected to an upper portion of the main chamber 31. A gas inlet 33A through which an inert gas such as argon (Ar) gas is introduced into the chamber 21 is provided in an upper portion of the pull chamber 32. A gas outlet 33B through which gas in the chamber 21 is discharged by driving a vacuum pump (not shown) is provided in a lower portion of the main chamber 31.

An inert gas introduced into the chamber 21 through the gas inlet 33A flows downward between the monocrystalline silicon 1 being grown and the heat shield 25, flows through a space between a lower end of the heat shield 25 and a liquid surface of the dopant-added melt MD, then flows between the heat shield 25 and an inner wall of the crucible 22 and further toward the outside of the crucible 22, then flows downward along the outside of the crucible 22, and is discharged through the gas outlet 33B.

The crucible 22, which is disposed in the main chamber 31, stores the dopant-added melt MD. The crucible 22 includes a support crucible 41, a quartz crucible 42 housed in the support crucible 41, and a graphite sheet 43 placed between the support crucible 41 and the quartz crucible 42. It should be noted that the graphite sheet 43 may not be provided.

The support crucible 41 is formed from, for instance, graphite or carbon fiber reinforced carbon. For instance, a surface of the support crucible 41 may be coated with silicon carbide (SiC) or pyrolytic carbon. The quartz crucible 42 contains silicon dioxide (SiO₂) as a main component. The graphite sheet 43 is formed from, for instance, exfoliated graphite.

The heater 23, which is disposed outside the crucible 22 at a predetermined distance therefrom, heats the dopant-added melt MD in the crucible 22. The pull-up unit 24 includes a cable 51 having an end to which a seed crystal 2 is attached and a pull-up driver 52 configured to raise, lower and rotate the cable 51.

At least a surface of the heat shield 25 is formed from a carbon material. The heat shield 25 is provided surrounding the monocrystalline silicon 1 when the monocrystalline silicon 1 is manufactured. The heat shield 25 shields the monocrystalline silicon 1 being grown from radiant heat from the dopant-added melt MD stored in the crucible 22, the heater 23, and a side wall of the crucible 22. The heat shield 25 also inhibits outward thermal diffusion from a solid-liquid interface (i.e., an interface where a crystal grows) and a vicinity thereof. Thus, the heat shield 25 serves to control a temperature gradient of each of a central portion and an outer peripheral portion of the monocrystalline silicon 1 in a pull-up axis direction.

The heat insulation material 26, which is substantially cylindrical, is formed from a carbon material (e.g., graphite). The heat insulation material 26 is disposed outside the heater 23 at a predetermined distance therefrom. The crucible driver 27, which includes a support shaft 53 supporting the crucible 22 from below, rotates, raises and lowers the crucible 22 at a predetermined speed.

The memory 12 stores various information necessary for manufacturing the monocrystalline silicon 1. Examples of the various information include a gas flow rate of Ar gas in the chamber 21, a furnace internal pressure of the chamber 21, electric power supplied to the heater 23, a rotation speed of the crucible 22, a rotation speed of the monocrystalline silicon 1, and a position of the crucible 22. The memory 12 further stores, for instance, a resistivity profile and a pull-up speed profile.

The controller 13 controls each of components on the basis of the various information stored in the memory 12 and a user's operation, thereby manufacturing the monocrystalline silicon 1.

Growing Method of Monocrystalline Silicon

Next, an example of the growing method of monocrystalline silicon according to the exemplary embodiment of the invention is described with reference to a flowchart shown in FIG. 2. In the exemplary embodiment, a case where the monocrystalline silicon 1 with a product diameter of 200 mm is manufactured is illustrated as an example. However, the product diameter is not limited to this value.

Further, examples of a volatile dopant to be added include red phosphorus (P), arsenic (As), and antimony (Sb). However, types of the volatile dopant are not limited thereto.

Figure 2:
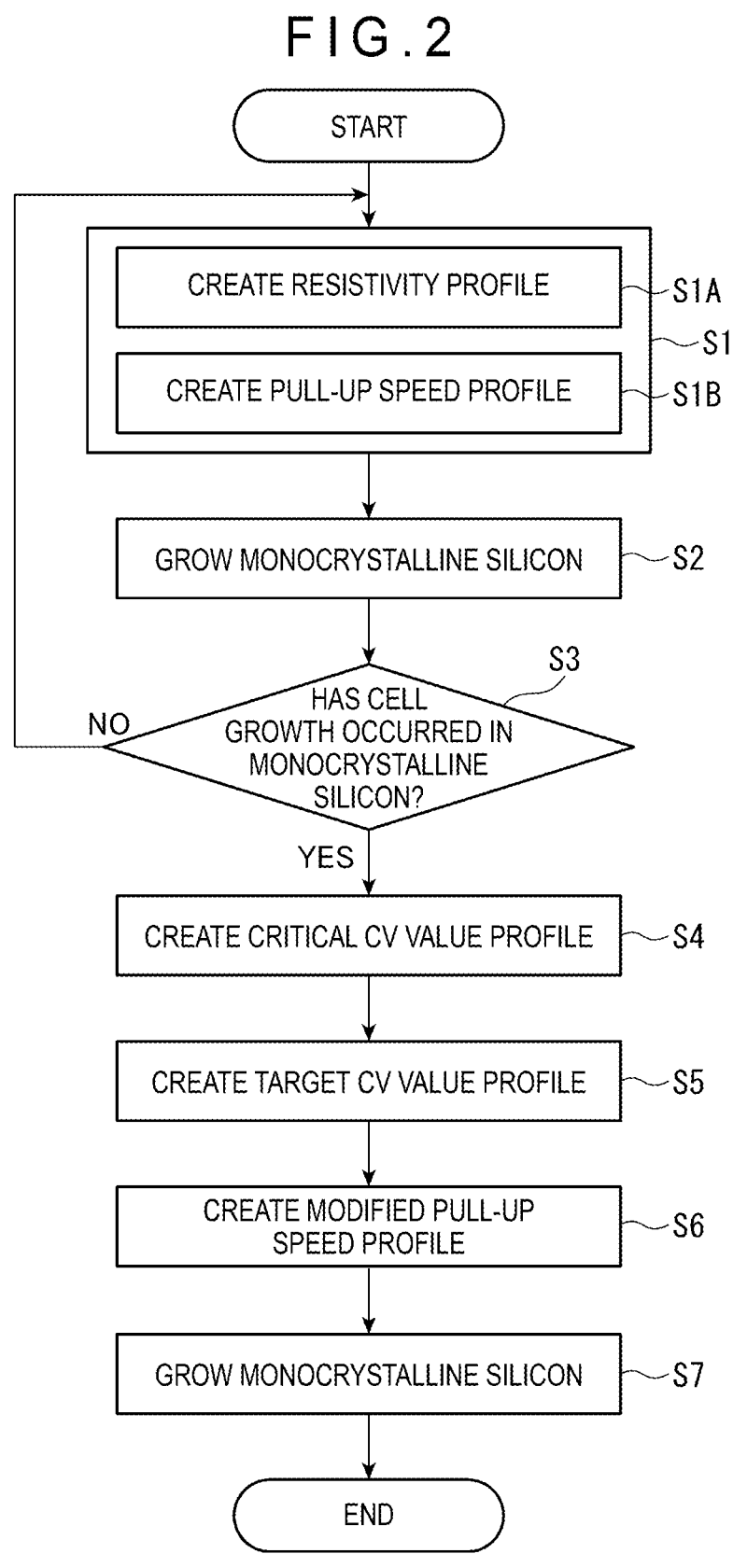

As shown in the flowchart in FIG. 2, the growing method of monocrystalline silicon includes a pull-up condition setting step S1, a single crystal growth step S2, an abnormal growth determination step S3, a critical CV value calculation step S4, a target CV value profile creation step S5, a pull-up condition resetting step S6, and a modified single crystal growth step S7, which are executed in this order.

The pull-up condition setting step S1 includes a resistivity profile creation step S1A and a pull-up speed profile creation step S1B. The pull-up conditions include at least one of the pull-up speed profile exhibiting planned values of a pull-up speed or the resistivity profile exhibiting planned values of a resistivity in a crystal axis direction.

When a resistivity distribution in the crystal axis direction depends on the furnace internal pressure or the flow rate of the inert gas flowing in the furnace, a change in the furnace internal pressure or the flow rate of the inert gas is included in a change in the resistivity profile.

Figure 3:
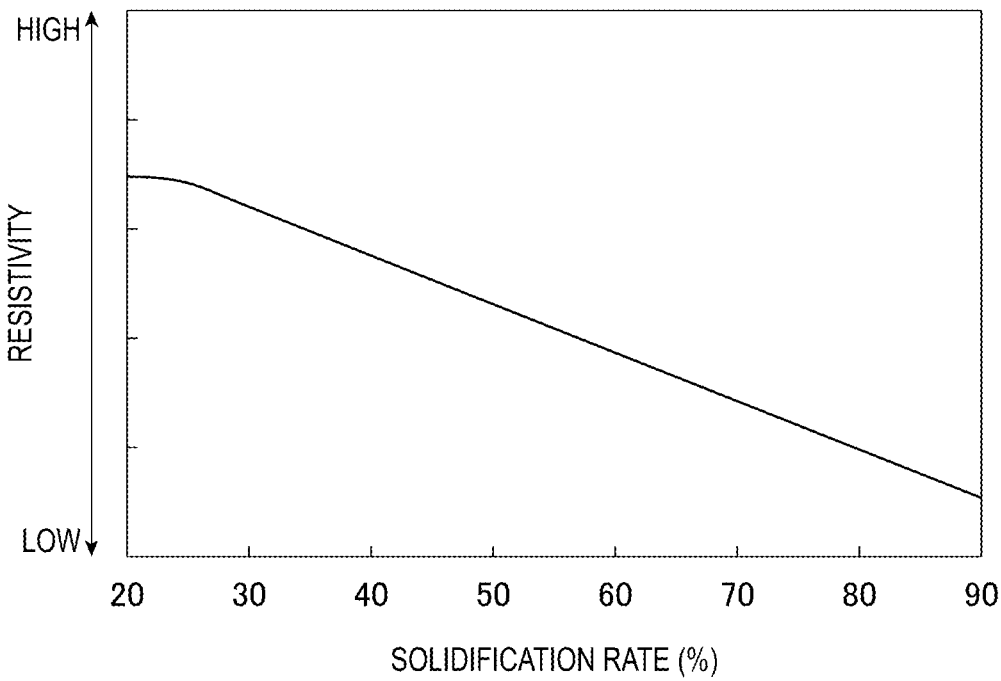
FIG. 3 illustrates an exemplary resistivity profile created by the growing method of monocrystalline silicon according to the exemplary embodiment to manufacture the monocrystalline silicon.

In the resistivity profile creation step S1A, the resistivity profile is created on the basis of target resistance values. FIG. 3 illustrates an exemplary resistivity profile created by the growing method of monocrystalline silicon according to the exemplary embodiment to manufacture the monocrystalline silicon. In FIG. 3, an abscissa axis represents the solidification rate (%) and an ordinate axis represents the resistivity. The solidification rate refers to a rate of a pulled-up weight of the monocrystalline silicon relative to an amount of a silicon material charged in the crucible.

The resistivity profile is created on the basis of target resistance values of a straight body of the monocrystalline silicon 1. The target resistivity of the straight body of the monocrystalline silicon 1 when red phosphorus is used as the dopant can be set in a range from 0.5 mΩ·cm to 1.3 mΩcm. The monocrystalline silicon with such a resistivity is referred to as ultralow-resistivity monocrystalline silicon.

Prior to pulling up the monocrystalline silicon 1, the resistivity profile can be calculated in consideration of, for instance, the dopant concentration in the dopant-added melt MD at the start of pulling up the monocrystalline silicon 1, a decrease in the dopant concentration in the dopant-added melt MD due to evaporation of the dopant from the dopant-added melt MD, and an increase in the dopant concentration in the dopant-added melt MD due to the segregation phenomenon accompanying the progress of pulling up the monocrystalline silicon 1.

Further, the resistivity profile calculation is improvable in accuracy by measuring a resistivity distribution in a longitudinal direction of the monocrystalline silicon 1 pulled up on the basis of the calculated resistivity profile and feed backing the measurement result to the resistivity profile calculation.

In the pull-up speed profile creation step S1B, the pull-up speed profile is created on the basis of the resistivity profile created in the resistivity profile creation step S1A.

Figure 4:
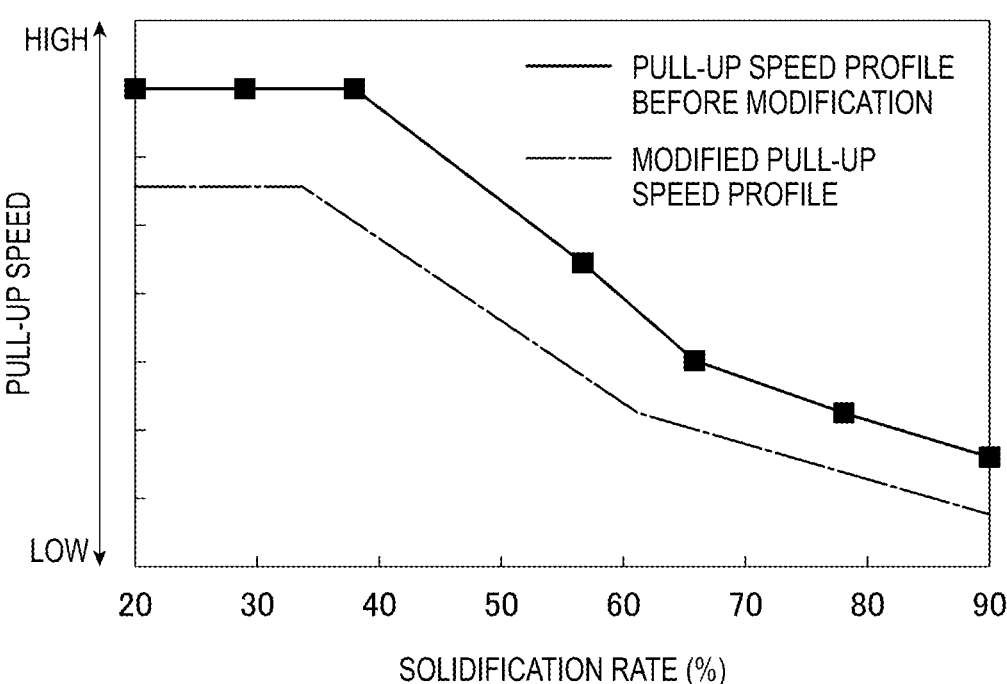
FIG. 4 illustrates an exemplary pull-up speed profile created by the growing method of monocrystalline silicon according to the exemplary embodiment to manufacture the monocrystalline silicon.

The pull-up speed profile includes information on target pull-up speeds to be obtained for the straight body of the monocrystalline silicon 1. FIG. 4 illustrates an exemplary pull-up speed profile created by the growing method of monocrystalline silicon according to the exemplary embodiment to manufacture the monocrystalline silicon. In FIG. 4, an abscissa axis represents the solidification rate (%) and an ordinate axis represents the pull-up speed.

The pull-up speed profile can be created by setting, for instance, eight pull-up speeds according to a length of the straight body. In the example shown in FIG. 4, the pull-up speed is set relatively high until a solidification rate of 40% and is set gradually lower as the straight body is longer (i.e., as the solidification rate is higher).

In the pull-up condition setting step S1, not only the resistivity profile and the pull-up speed profile are created but also manufacturing conditions of the monocrystalline silicon 1 are set. Examples of the manufacturing conditions of the monocrystalline silicon 1 include an oxygen concentration in the monocrystalline silicon 1, the gas flow rate of Ar gas, the furnace internal pressure, the rotation speed of the crucible 22, the rotation speed of the monocrystalline silicon 1, and the position of the crucible 22.

The controller 13 stores the set pull-up conditions and the like in the memory 12. The controller 13 reads out the pull-up speed profile and the like from the memory 12 and executes each step on the basis of the read pull-up speed profile and the like.

In the single crystal growth step S2, the controller 13 first controls a power supply device (not shown) that supplies electric power to the heater 23 to heat the crucible 22, melting the silicon material and the dopant in the crucible 22 to generate the dopant-added melt MD.

Next, the controller 13 introduces Ar gas at a predetermined flow rate into the chamber 21 through the gas inlet 33A and, by controlling a vacuum pump (not shown), discharges gas in the chamber 21 through the gas outlet 33B to reduce pressure in the chamber 21, thereby keeping the inside of the chamber 21 in an inert atmosphere under reduced pressure.

Then, the controller 13 controls the pull-up driver 52 to lower the cable 51 to dip the seed crystal 2 into the dopant-added melt MD.

Subsequently, the controller 13 controls the crucible driver 27 to rotate the crucible 22 in a predetermined direction and controls the pull-up driver 52 to pull up the cable 51 while rotating the cable 51 in a predetermined direction, thereby growing the monocrystalline silicon 1. Specifically, the monocrystalline silicon 1 is grown in the order of a neck 3, a shoulder, a straight body, and a tail.

Next, the controller 13 controls the pull-up driver 52 to separate the tail of the monocrystalline silicon 1 from the dopant-added melt MD. Then, the controller 13 controls the pull-up driver 52 to further pull up the cable 51, cooling the monocrystalline silicon 1 separated from the dopant-added melt MD.

Subsequently, after it is confirmed that the cooled monocrystalline silicon 1 is housed in the pull chamber 32, the monocrystalline silicon 1 is taken out of the pull chamber 32.

In the abnormal growth determination step S3, whether or not the cell growth has occurred in the monocrystalline silicon 1 taken out is determined. The monocrystalline silicon in which the cell growth has occurred is easily polycrystallized, because a phenomenon in which the silicon melt is locally solidified in a form of dendrites is caused on a surface where the monocrystalline silicon is grown (i.e., the solid-liquid interface where the silicon melt in the crucible is solidified to be crystallized).

Thus, whether the cell growth has occurred in the monocrystalline silicon 1 can be determined by, for instance, vertically dividing a portion of the crystal with or near the dislocation, subjecting the vertically divided surface to selective etching, and subsequently observing the surface with an optical microscope at a magnification of 50×. In a portion where the cell growth has occurred, linear polycrystalline regions slightly extending in a substantially growth direction are observed.

When no cell growth occurs (No), the process returns to the pull-up condition setting step S1, continuing to manufacture the monocrystalline silicon 1. At this time, in the pull-up condition setting step S1, a new resistivity profile and the like may be created, or the same profile(s) may be used to continue to manufacture the monocrystalline silicon 1. The crucible 22 is preferably changed, but manufacturing of the monocrystalline silicon 1 may be continued with the crucible 22 unchanged.

When the cell growth has occurred (Yes), the critical CV value calculation step S4 described below is executed.

In the critical CV value calculation step S4, the CV value (critical CV value), which is a product of the dopant concentration C and the pull-up speed V at a point of time when the cell growth occurred, is calculated and a critical CV value profile is created by plotting a plurality of critical CV values. "A point of time" herein literally means "that moment". Further, "a point of time" can be also expressed as a solidification rate. For instance, when the cell growth occurred at a solidification rate of X %, the critical CV value to be calculated is a critical CV value at the solidification rate of X %.

Here, the point of time when the cell growth occurred refers to a point of time when the cell growth occurred on the solid-liquid interface where the melt in the crucible is solidified to be crystallized during crystal growth. The critical CV value refers to a product of the dopant concentration C and the pull-up speed V at a point of time when the cell growth occurred on the solid-liquid interface where the melt in the crucible is solidified to be crystallized during crystal growth.

The critical CV values are calculated in a length direction of the monocrystalline silicon 1. The number of the critical CV values to be calculated may depend on the length of the straight body or a position where the cell growth occurred. In the critical CV value calculation step S4, the position where the cell growth occurred is also recorded.

The dopant concentration C is a dopant concentration in the monocrystalline silicon. The dopant concentration in the monocrystalline silicon 1 can be calculated from a resistance value of the monocrystalline silicon by using a relational expression of the dopant concentration in the monocrystalline silicon and the resistivity of the monocrystalline silicon. As the relational expression, Irvin curves, ASTM standard F723 or the like is usable.

The resistivity measurement is performed on the monocrystalline silicon 1 taken out in a form of an ingot before subjecting the monocrystalline silicon to grinding on the outer periphery and cutting into blocks. Alternatively, the resistivity measurement may be performed after cutting the monocrystalline silicon 1 in the form of the ingot into blocks, or performed on a sample taken from the ingot. As a measuring method of the resistivity, for instance, a four-probe method is usable.

For instance, when the dopant is red phosphorus and the resistivity is 1 mΩ·cm, the dopant concentration C can be calculated as $7.4 \times 10^{19}$ atoms/cm³.

An example of how to obtain the dopant concentration C constituting the critical CV value is specifically described. The dopant concentration C constituting the critical CV value is obtained by first cutting a sample out of the crystal, measuring the resistivity of a portion of the sample where the cell growth has occurred through the four-probe method, and performing calculation from the measured resistivity using the relational expression of the impurity concentration in the crystal and the resistivity of the crystal.

A method of obtaining the dopant concentration C in the monocrystalline silicon is not limited to the above method. For instance, the dopant concentration C may be directly measured from the monocrystalline silicon 1, if possible. As the dopant concentration C, the dopant concentration in the dopant-added melt MD may be usable in place of the dopant concentration in the monocrystalline silicon 1.

The pull-up speed V can be calculated from the pull-up speed profile.

The pull-up speed V is not necessarily calculated from the pull-up speed profile and may be a pull-up speed actually measured. The pull-up speed actually measured may be an instantaneous speed or an average speed in a predetermined time period. Thus, the pull-up speed V constituting the critical CV value can be obtained by determining, from the pull-up speed profile or data of the pull-up speed recorded in the crystal growth, the pull-up speed at the time when the cell growth occurred.

Figure 5:
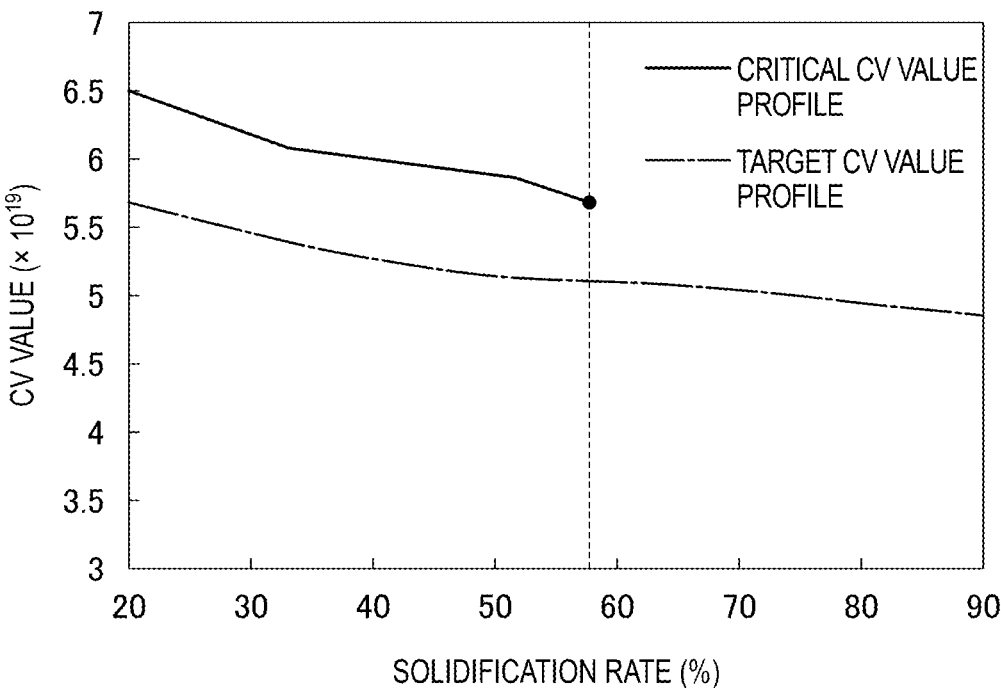
FIG. 5 illustrates an exemplary graph in which CV values are plotted.

FIG. 5 illustrates an exemplary graph in which CV values are plotted (abscissa axis: solidification rate (%); ordinate axis: CV value). The critical CV value profile is shown in a solid line. The critical CV values shown in the solid line are CV values when the cell growth occurred.

It is understood from the example shown in FIG. 5 that the critical CV value gradually decreases from $6.5 \times 10^{19}$.

In the target CV value profile creation step S5, a target CV value profile is created by using a plurality of target CV values (CV values to be targeted) that do not exceed the critical CV values calculated in the critical CV value calculation step S4. Specifically, it is created a target CV value profile with CV values that are smaller than the critical CV values (actual results) when the cell growth occurred. FIG. 5 illustrates the target CV value profile in a dashed-dotted line.

More specifically, the target CV value profile can be created, for instance, by making the target CV values less than 90% of the critical CV values when the cell growth occurred.

At target CV values of equal to or more than 90% of the critical CV values, when the dopant concentration near the interface between the crystal and the melt or the crystal growth speed fluctuates, the CV value may temporarily reach the critical CV value to generate the cell growth in the single crystal and consequent dislocation. In contrast, when neither the dopant concentration near the interface between the crystal and the melt nor the crystal growth speed fluctuates, the target CV values can be set equal to or more than 90% of the critical CV values.

In the target CV value profile, the target CV values constituting the target CV value profile are preferably equal to or more than 50% of the critical CV values. At target CV values below 50% of the critical CV values, for instance, when the pull-up speed V is adjusted, productivity significantly decreases, which is not preferable. In the target CV value profile, the target CV values are more preferably equal to or more than 80% of the critical CV values.

For instance, when the cell growth occurred at a solidification rate of 57% and the CV value at the point was $6\times10^{19}$, the target CV value profile is examined so that the CV value at the point is equal to or less than $5.4\times10^{19}$. In the example shown in FIG. 5, although the critical CV values to be referred to are not recorded after the solidification rate of 57%, a user may set target CV values on the basis of a tendency of the critical CV values until the solidification rate of 57%.

The above-described target CV value profile is merely exemplary. When inhibiting the occurrence of the cell growth is emphasized, the target CV value profile may be created with even smaller target CV values.

The inventors have studied a method of predicting a critical point at which the cell growth occurs in order to inhibit the occurrence of the cell growth in pulling up the monocrystalline silicon 1. As the method of predicting the critical point at which the cell growth occurs, the inventors have found a method of using, as an index, the critical CV values when the cell growth occurred. Specifically, the inventors have conceived that the critical CV values serve as an index for setting pull-up conditions for inhibiting the occurrence of the cell growth and it is only necessary to reset at least one of the pull-up speed profile or the resistivity profile by using the critical CV values.

That is, the inventors have conceived that the occurrence of the cell growth can be inhibited by examining CV values (target CV values) so as not to be higher than the critical CV values when the cell growth occurred and setting the pull-up conditions that satisfy the target CV values. The reason for using the critical CV values as an index for determining the pull-up conditions in the growing method of monocrystalline silicon of the invention is as described above.

In the pull-up condition resetting step S6, it is created a modified pull-up speed profile constituted by pull-up speeds V that correspond to the target CV value profile created in the target CV value profile creation step S5. Specifically, the resistivity profile is the same as that created in the resistivity profile creation step S1A, and a modified pull-up speed profile with reduced pull-up speeds V is created to make the target CV values smaller than the critical CV values.

For instance, when the target CV value at a point at which the solidification rate is 20% is $5\times10^{19}$ and the dopant concentration C based on the resistivity at that point (resistivity obtained by referring to the resistivity profile) is $7.4\times10^{19}$ atoms/cm$^3$, the pull-up speed can be calculated as 0.68 mm/min. FIG. 4 illustrates an exemplary modified pull-up speed profile in a dashed-dotted line that is modified on the basis of the target CV value profile.

It should be noted that the resistivity profile is not necessarily the same as that created in the resistivity profile creation step S1A and may be modified on the basis of actual results when the cell growth occurred to inhibit the occurrence of the cell growth. Specifically, in the pull-up condition resetting step S6, it may be created a modified resistivity profile constituted by resistivities corresponding to the target CV value profile.

In other words, although the modified pull-up speed profile is created on the basis of the target CV value profile in the pull-up condition resetting step S6 of the exemplary embodiment, the invention is not limited thereto. The resistivity profile may be modified on the basis of the target CV value profile in the pull-up condition resetting step S6. The dopant concentration C and the electrical resistivity of the monocrystalline silicon are in a one-to-one relationship. Thus, modifying the target CV value profile makes the dopant concentration C modified.

That is, it is only necessary to control at least one of the dopant concentration C or the pull-up speed V to make the CV value below the critical CV value.

In the modified single crystal growth step S7, the monocrystalline silicon is pulled up by the same method as in the single crystal growth step S2.

According to the exemplary embodiment, using the CV values as an index for setting the pull-up conditions allows the pull-up conditions to be more quickly set than the conventional method that requires referring to the temperature gradient G of the melt under the solid-liquid interface.

Further, calculating the target CV values and setting the pull-up conditions that satisfy the target CV values can inhibit an increase in the resistivity of the monocrystalline silicon 1.

The dopant concentration C constituting the CV value can be calculated using the resistance value of the monocrystalline silicon 1, the Irvin curves, and the like, making it possible to more accurately calculate the pull-up speed V from the CV value without an excessive decrease in the pull-up speed V. It is thus possible to inhibit an increase in the resistivity of the monocrystalline silicon that may otherwise be caused by the excessive decrease in the pull-up speed V.

In the above exemplary embodiment, it is created the resistivity profile or the like in which the resistivity or the like corresponds to the solidification rate of the monocrystalline silicon. The invention, however, is not limited thereto. For instance, it may be created a resistivity profile or the like in which the resistivity or the like corresponds to a position in the longitudinal direction of the monocrystalline silicon or a resistivity profile or the like in which the resistivity or the like corresponds to a position of the straight body with a start position of the straight body being 0% and an end position of the straight body being 100%.

The dopant concentration C and the electrical resistivity of the monocrystalline silicon are in a one-to-one relationship. The invention thus includes an embodiment where a product of the electrical resistivity and the pull-up speed is used instead of the CV value, which is a product of the dopant concentration C and the pull-up speed V.

The invention claimed is:

1. A growing method of pulling up monocrystalline silicon from a dopant-added melt in which a dopant is added to a silicon melt and growing the monocrystalline silicon according to a Czochralski process, the growing method comprising:

in a case that an abnormal growth occurs in the monocrystalline silicon, calculating a critical CV value, which is a product of a dopant concentration C and a pull-up speed V at a solidification rate at a point of time when the abnormal growth occurs, and creating a critical CV value profile;

creating a target CV value profile by using a target CV value that is less than 90% and equal to or more than 50% of the critical CV value at each solidification rate in the critical CV value profile, and resetting at least one of a pull-up speed profile or a resistivity profile in a crystal axis direction to make a CV value, which is a product of the dopant concentration C and the pull-up speed V at each solidification rate of the monocrystalline silicon, satisfy the target CV value at each solidification rate in the target CV value profile.

2. The growing method according to claim 1, wherein the resetting comprises creating a modified pull-up speed profile constituted by a pull-up speed corresponding to the target CV value profile.

3. The growing method according to claim 1, wherein the resetting comprises creating a modified resistivity profile constituted by a resistivity corresponding to the target CV value profile.

4. The growing method according to claim 1, wherein the dopant concentration C is a dopant concentration in the monocrystalline silicon, and the dopant concentration in the monocrystalline silicon is calculated from a resistance value of the monocrystalline silicon by using a relational expression of the dopant concentration in the monocrystalline silicon and the resistivity of the monocrystalline silicon.

* * * * *